(12) United States Patent
Lee et al.

(10) Patent No.: US 8,735,278 B2
(45) Date of Patent: May 27, 2014

(54) COPPER ETCH SCHEME FOR COPPER INTERCONNECT STRUCTURE

(75) Inventors: Ming Han Lee, Taipei (TW); Hai-Ching Chen, Hsinchu (TW); Hsiang-Huan Lee, Jhodong Township (TW); Tien-I Bao, Dayuan Township (TW); Chi-Lin Teng, Taichung (TW)

(73) Assignee: Taiwan Semiconductor Manufactring Co., Ltd., Hsin-Chu (TW)

( * ) Notice: Subject to any disclaimer, the term of this patent is extended or adjusted under 35 U.S.C. 154(b) by 0 days.

(21) Appl. No.: 13/550,951

(22) Filed: Jul. 17, 2012

(65) Prior Publication Data

US 2014/0021611 A1    Jan. 23, 2014

(51) Int. Cl.
*H01L 21/4763* (2006.01)
(52) U.S. Cl.
USPC ............ 438/618; 257/774; 438/622

(58) Field of Classification Search
USPC .................... 257/774; 438/618, 622
See application file for complete search history.

(56) References Cited

U.S. PATENT DOCUMENTS

2002/0155693 A1* 10/2002 Hong et al. .......... 438/618
2005/0218519 A1* 10/2005 Koike et al. .......... 257/756

* cited by examiner

*Primary Examiner* — David Wu
*Assistant Examiner* — Brandon Fox
(74) *Attorney, Agent, or Firm* — Eschweiler & Associates, LLC (57) ABSTRACT

The present disclosure is directed to a method of manufacturing an interconnect structure in which a low-k dielectric layer is formed over a semiconductor substrate followed by formation of a copper or copper alloy layer over the low-k dielectric layer. The copper or copper alloy layer is patterned and etched to form a copper body having recesses, which are then filled with a low-k dielectric material. The method allows for formation of a damascene structures without encountering the various problems presented by non-planar features and by porus low-K dielectric damage.

11 Claims, 11 Drawing Sheets

COPPER ETCH SCHEME FOR COPPER INTERCONNECT STRUCTURE

BACKGROUND

As the density of semiconductor devices increases and the size of circuit elements becomes smaller, the resistance capacitance (RC) delay time increasingly dominates the circuit performance. To reduce the RC delay, there is a desire to switch from conventional dielectrics to low-k dielectrics. These materials are particularly useful as intermetal dielectrics, IMDs, and as interlayer dielectrics, ILDs. However, low-k materials present problems during processing, especially during the processing of the conductive material used to make interconnects.

DETAILED DESCRIPTION

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one of ordinary skill in the art, that one or more aspects described herein may be practiced with a lesser degree of these specific details. In other instances, known structures and devices are shown in block diagram form to facilitate understanding.

Semiconductor devices are manufactured or fabricated on semiconductor wafers using a number of different processing steps to create transistor and interconnection elements. To electrically connect transistor terminals associated with the semiconductor wafer, conductive (e.g., metal) trenches, vias, and the like are formed in dielectric materials as part of the semiconductor device. The trenches and vias couple electrical signals and power between transistors, internal circuit of the semiconductor devices, and circuits external to the semiconductor device.

In forming the interconnection elements the semiconductor wafer may undergo, for example, masking, etching, and deposition processes to form the desired electronic circuitry of the semiconductor devices. In particular, multiple masking and etching steps can be performed to form a pattern of recessed areas in a dielectric layer, such as a low-k dielectric layer, on a semiconductor wafer that serve as trenches and vias for the interconnections. A deposition process may then be performed to deposit a metal layer over the semiconductor wafer thereby depositing metal both in the trenches and vias and also on the non-recessed areas of the semiconductor wafer. To isolate the interconnections, such as patterned trenches and vias, the metal deposited on the non-recessed areas of the semiconductor wafer is removed.

The above masking, etching and deposition processes, however, often result in non-planar surface topologies. For example, the non-planar topology may include a hump and recess corresponding generally to the underlying densely spaced recessed regions and wide opening recessed regions respectively. Hump, recess, and other non-planar features may be caused, for example, by the plating chemistry in an electroplating process. Humps may degrade the performance of the formed devices. For example, a hump left above densely spaced trenches or vias may cause an electrical short circuit between adjacent lines and recesses may result in the reduction of the conductance of the formed interconnection lines.

Additionally, the low-k dielectric materials are susceptible to damage from the etching processes because they are softer, less chemically stable or more porous, or any combination of these factors. The plasma damage can manifest itself in higher leakage currents, lower breakdown voltages, and changes in the dielectric constant associated with the low-k dielectric material.

There is, therefore, a need in the integrated circuit manufacturing art to develop a manufacturing process whereby damascene structures may be formed without encountering the various problems presented non-planar features and by porous low-K dielectric layers to improve integrated circuit device yield, performance, and reliability.

Accordingly, the present disclosure is directed to methods of fabrication of an interconnect structure. The methods provide a copper etching process for defining an interconnect structure that eliminate non-planar features and low-k dielectric damage caused during etching processes. The methods further allow good copper gap filling.

Figure 1A:
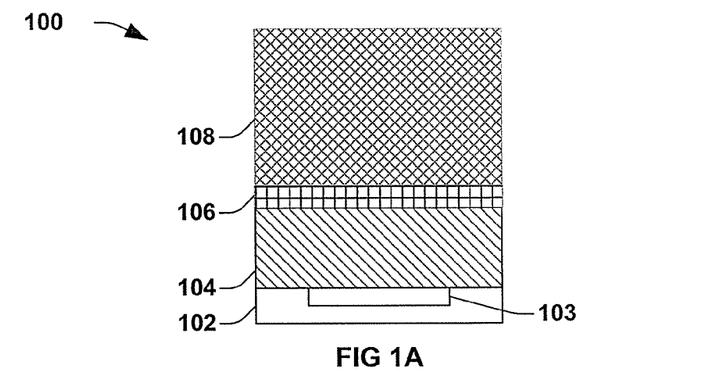
FIGS. 1A-1L are partial cross sectional views illustrating steps of one embodiment of forming an interconnect structure in accordance with the disclosure.

FIGS. 1A-1L illustrate a plurality of partial cross section diagrams illustrating one embodiment of a method of forming an interconnect structure at stages in the manufacturing process according to the disclosure. Referring to FIG. 1A, a semiconductor substrate 102 having a conductive region 103 is provided. Substrate 102 is understood to include a semiconductor wafer or substrate, comprised of a semiconducting material such as silicon or germanium, or a silicon on insulator structure (SOI). Semiconductor structure can further include one or more conductive layers (such as metal or silicon) and/or insulating layers, and one or more active or passive devices formed in or over the substrate or the like.

Overlying substrate 102 and covering conductive region 103 is a low-k dielectric layer 104. The low-k dielectric includes dielectrics with k less than about 4. Such dielectrics include, for example, carbon-doped silicon dioxide, also referred to as organosilicate glass (OSG) and carbon-oxide. Low-k materials may also include borophosphosilicate glass (BPSG), borosilicate glass (BSG), and phosphosilicate glass (PSG), among others. The dielectric layer 104 may be formed using, for example, tetraethyl orthosilicate (TEOS), chemical vapor deposition (CVD), plasma enhanced CVD (PECVD), low pressure CVD (LPCVD), or spin-on coating techniques.

A first barrier layer 106 is formed overlying the dielectric layer 104. First barrier layer 106 is configured to prevent copper layer 108 above barrier layer 106 from penetrating into the dielectric layer 104. First barrier layer 106 can be formed from a dielectric material such as, in one embodiment, a silicon carbide, silicon nitride or silicon oxycarbide. The thickness of the barrier layer 106 will be from about 1 nm to about 10 nm. A copper layer 108 is then formed over barrier layer 106.

Figure 1B:
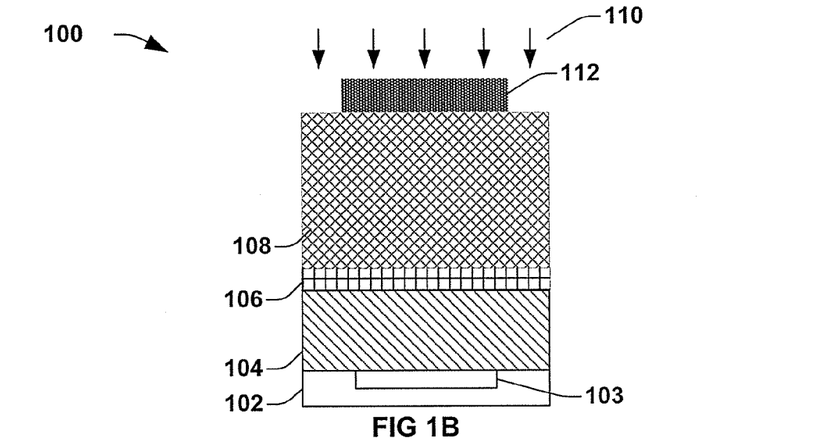

Following deposition of the copper layer 108, in one embodiment, a photoresist film 112 is formed by process 110 over the copper layer 108, as illustrated in FIG. 1B. Conventional photoresist materials may be used. The photoresist film 112 can be a carbon-containing, organic material. Various photoresists having various thicknesses may be used.

Figure 1C:
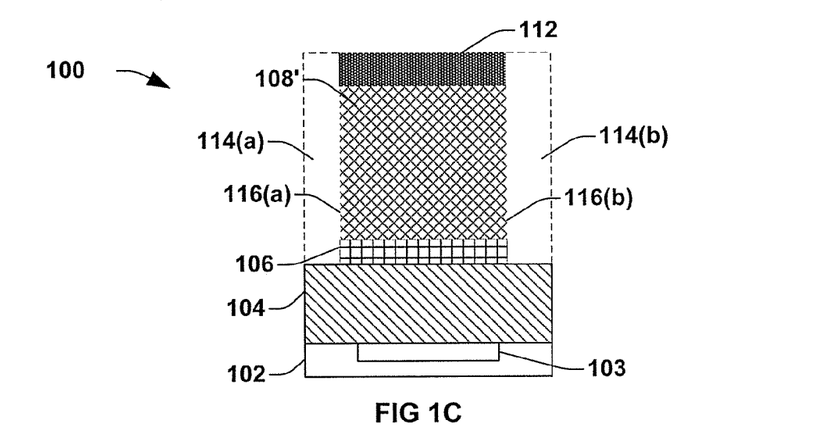

Conventional photoresist patterning techniques are used and followed by Cu etching techniques to copper layer 108 to remove a portion of copper layer 108 and form a first feature having a copper body 108' in FIG. 1C. Copper body 108' includes first recesses 114(a), 114(b) defined by opposing sidewalls 116(a), 116(b) of copper body 108'. Following formation of copper body 108', photoresist film 112 is removed by, in one embodiment, a plasma operation (not shown).

Figure 1D:
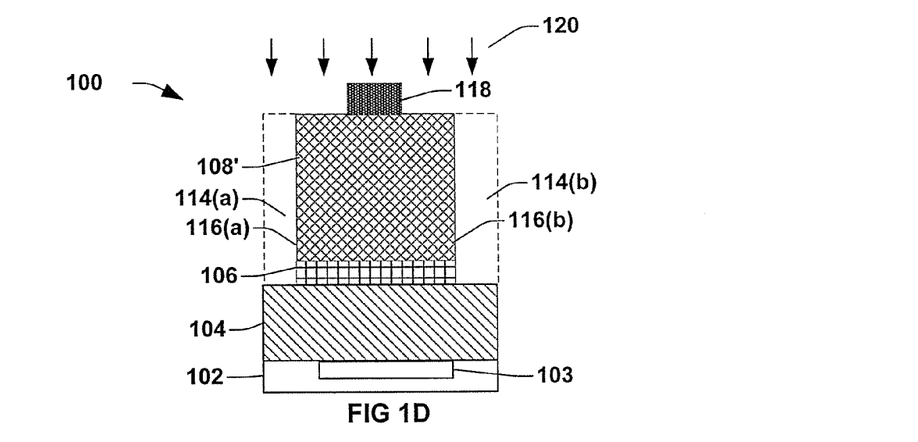
Figure 1E:
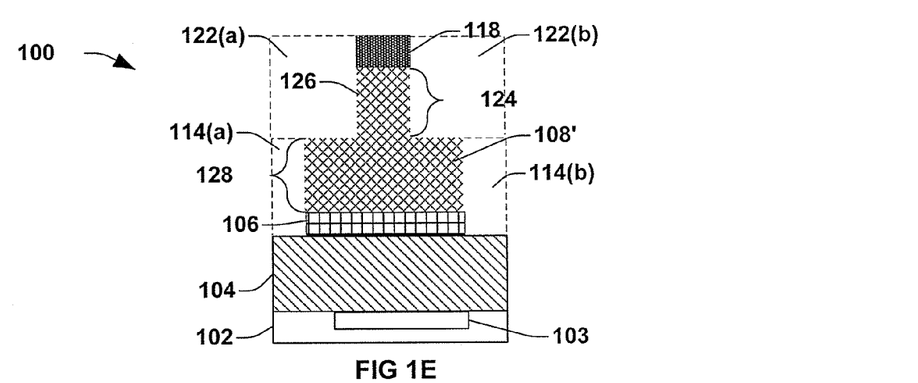

Turning to FIG. 1D, a photoresist film 118 is deposited by process 120 over copper body 108'. Conventional photoresist patterning techniques, followed by etching techniques are used to pattern and etch copper body 108', thereby forming a second feature in copper body 108' to form second recesses 122(a), 122(b) in an upper region 124 of the body 108' to define a vertical element 126 extending upward from a lower region 128 of the body 108', as illustrated if FIG. 1E. In one embodiment, upper region 124 of the body 108' comprises a via and lower region 128 of the body 108' comprises a trench. Photoresist film 118 is then removed (not shown).

Figure 1F:
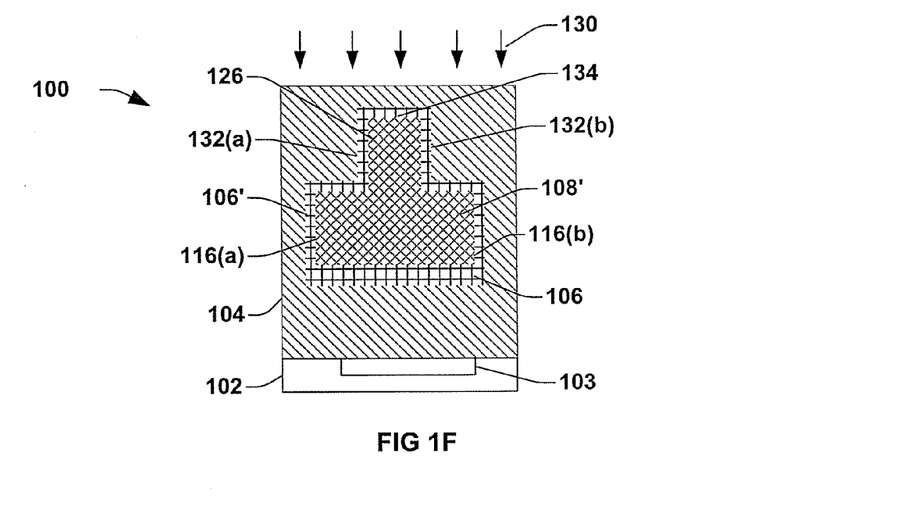

In FIG. 1F, barrier layer 106' is extended to encompass copper body 108' by depositing 130 barrier layer 106' about opposing sidewalls 116(a) and 116(b) of copper body 108' and about sidewalls 132(a), 132(b) and upper surface 134 of vertical element 126 to form a continuous layer 106'. Following formation of barrier layer 106', low-k dielectric material is deposited to fill first 114(a), 114(b) and second 122(a), 122(b) recesses and overlying the upper surface 134 of the vertical element 126.

Figure 1G:
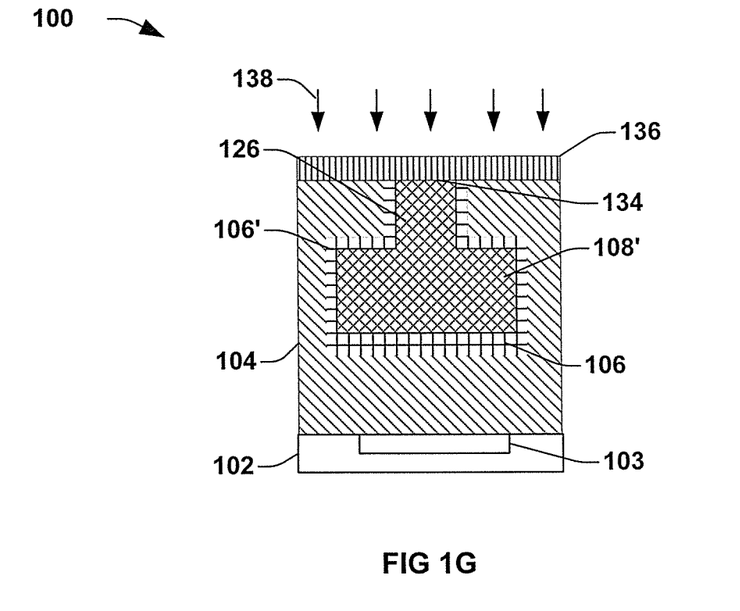

In FIG. 1G, a chemical mechanical polishing (CMP) process (not shown) is then performed to expose upper surface 134 of the vertical element 126. A second barrier layer 136 is deposited by process 138 over exposed upper surface 134 of vertical element 126. Second barrier layer 136 can be formed from a dielectric material, for example, silicon carbide or silicon oxynitride. The second barrier layer 136 can be deposited, in one embodiment, at a thickness of about 30 A° (Angstroms) or less. In one embodiment, the second barrier layer 136 can be formed from the same material as the first barrier layer 106. In a further embodiment, second barrier layer 136 is formed from a material different from the first barrier layer 106.

Figure 1H:
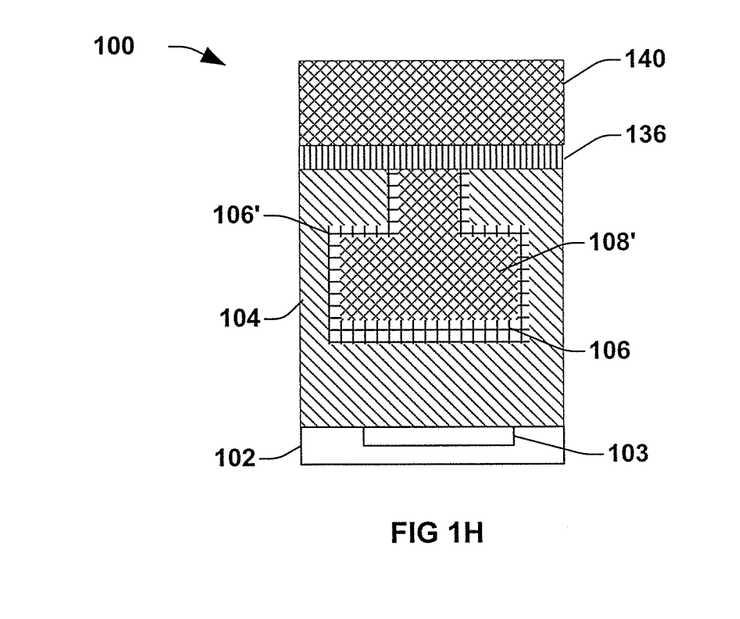
Figure 1I:
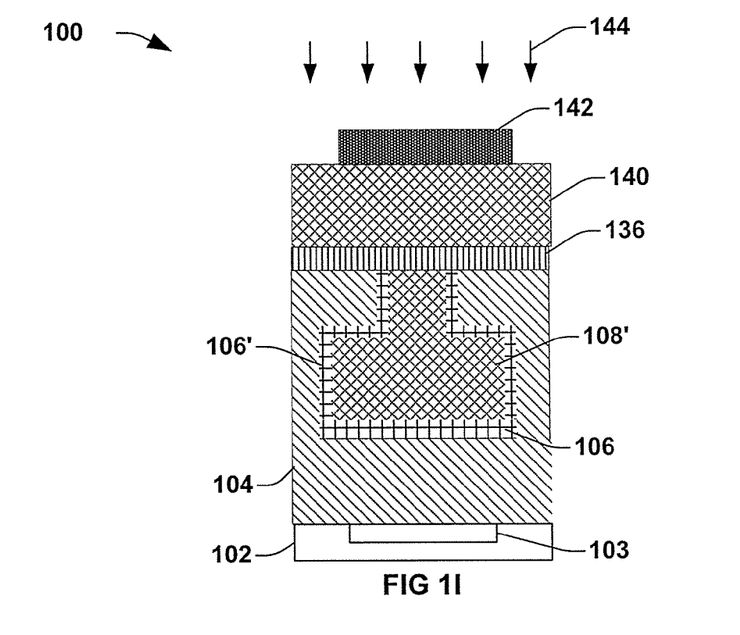
Figure 1J:
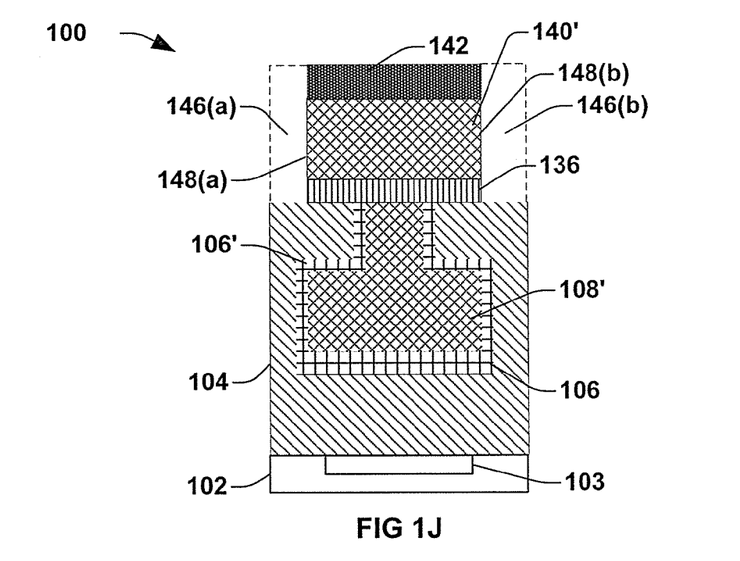

Following formation of the second barrier layer 136, an additional copper layer 140 is formed overlying vertical element 126 and electrically coupled to vertical element 126, as illustrated in FIG. 1H. Photoresist 142 is then deposited in FIG. 1I by process 144 to pattern and etch copper layer 140 to form recesses 146(a), 146(b) in copper layer 140 to form an additional copper body 140' having opposing sidewalls 148(a), 148(b), as shown if FIG. 1J. Photoresist 142 is then removed (not shown).

Figure 1K:
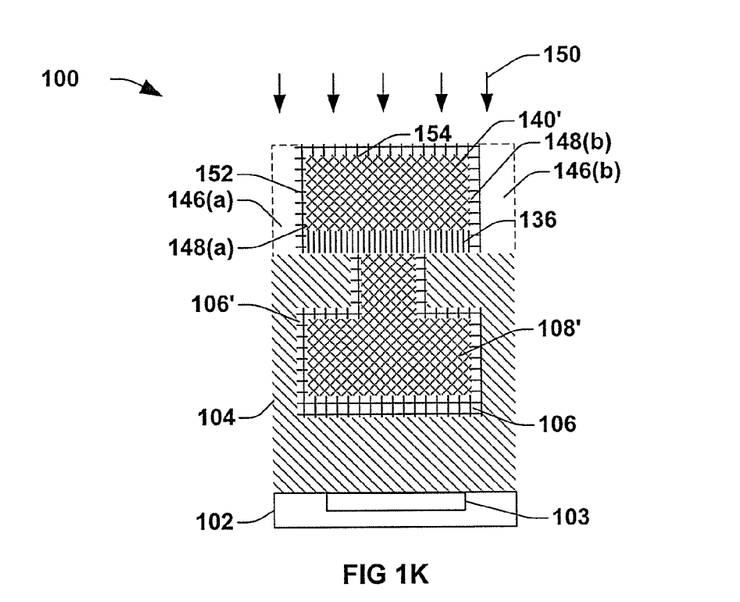
Figure 1L:
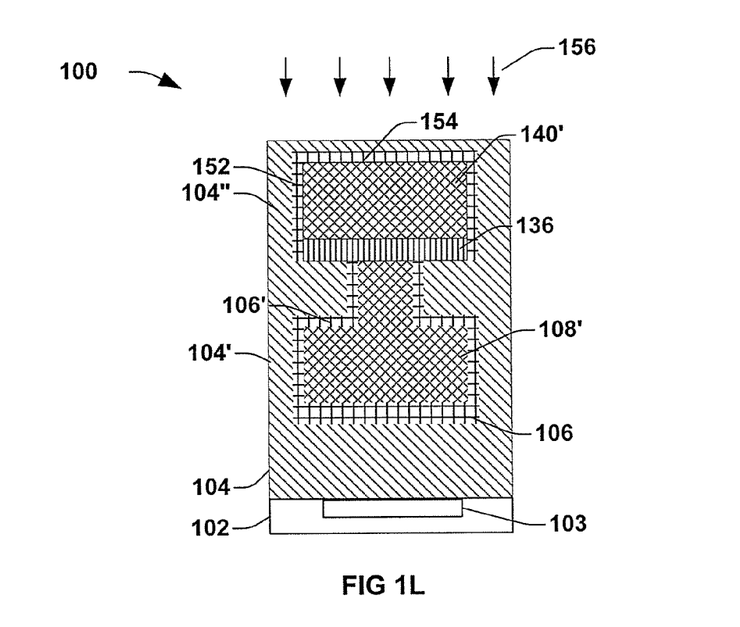

Barrier layer 152 is then formed by depositing 150 barrier layer 152 in FIG. 1K to encompass copper body 140' about opposing sidewalls 148(a) and 148(b) and upper surface 154 of copper body 140'. Barrier layer 152 can be, in one embodiment, the same material as barrier layer 106. Following formation of barrier layer 152, low-k dielectric material 104'' is deposited by process 156 to fill recesses 146(a) and 146(b) of copper body 140', as shown in FIG. 1L.

Figure 2A:
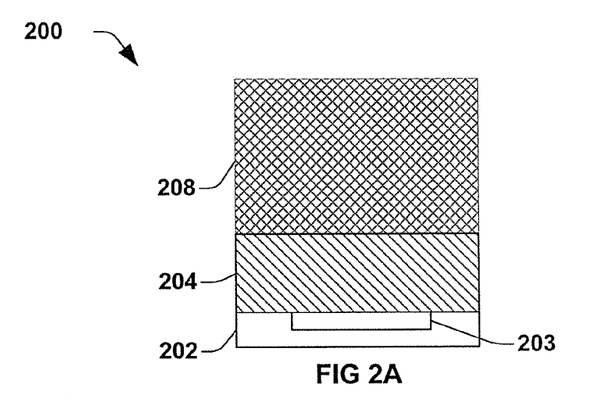
FIGS. 2A-2L are partial cross sectional views illustrating steps of a further embodiment of forming an interconnect structure in accordance with the disclosure

FIGS. 2A-2L 1L illustrate a plurality of partial cross section diagrams illustrating a further embodiment of a method of forming an interconnect structure at stages in the manufacturing process according to the disclosure. Referring to FIG. 2A, a semiconductor substrate 202 having a conductive region 203 is provided.

Overlying substrate 202 and covering conductive region 203 is a low-k dielectric layer 204. A copper alloy layer 208 is formed overlying the dielectric layer 204. The alloy element will be selected based upon the ability to exhibit surface segregation behavior upon annealing at temperatures lower than 400° C. Copper alloy layer 208 can be formed from alloying elements such as, in one embodiment, Mg, Al, Cr, Mn, Ti and the like. The concentration of the alloy can be, in one embodiment, from about 0.5% up to about 50% of the total metal content.

Figure 2B:
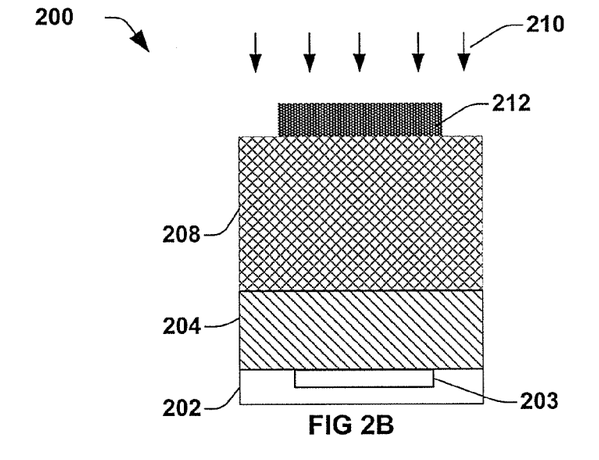
Figure 2C:
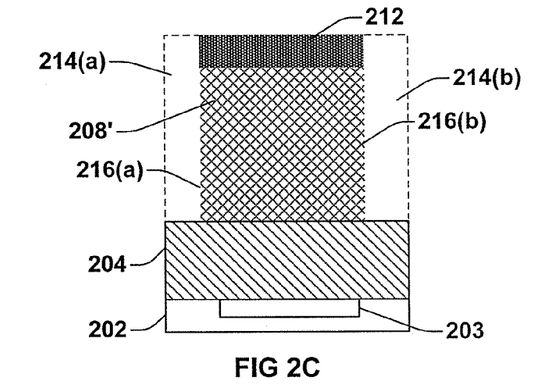

Following deposition of the copper alloy layer 208, in one embodiment, a photoresist film 212 is formed by process 210 over the copper alloy layer 208, as illustrated in FIG. 2B. Conventional photoresist patterning techniques are used and followed by Cu etching techniques to copper alloy layer 208 to remove a portion of copper alloy layer 208 and form a first feature having a copper body 208' in FIG. 2C. Copper alloy body 208' includes first recesses 214(a), 214(b) defined by opposing sidewalls 216(a), 216(b) of copper alloy body 208'. Following formation of copper alloy body 208', photoresist film 212 is removed by, in one embodiment, a plasma operation (not shown).

Figure 2D:
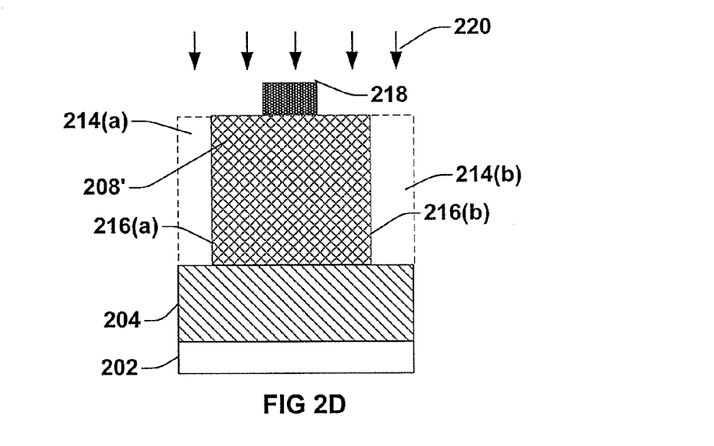
Figure 2E:
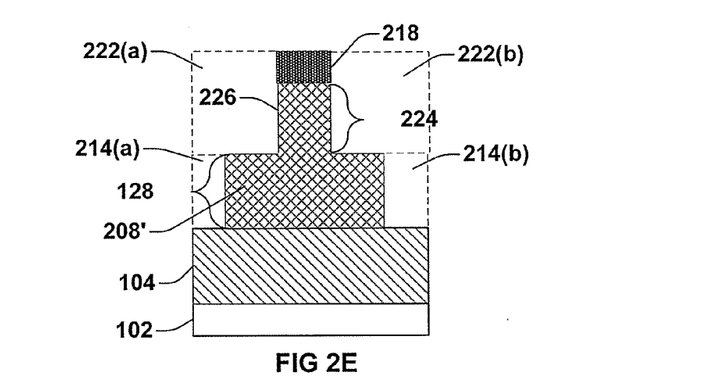

In FIG. 2D, a photoresist film 218 is deposited by process 220 over copper alloy body 208'. Conventional photoresist patterning techniques, followed by Cu etching techniques to pattern and etch copper alloy body 208', thereby forming a second feature in copper alloy body 208' to form second recesses 222(a), 222(b) in an upper region 224 of the copper alloy body 208' to define a vertical element 226 extending upward from a lower region 228 of the copper alloy body 208', as illustrated in FIG. 2E. In one embodiment, upper region 224 of the copper alloy body 208' comprises a via and lower region 228 of the copper alloy body 208' comprises a trench. Photoresist film 218 is then removed (not shown).

Figure 2F:
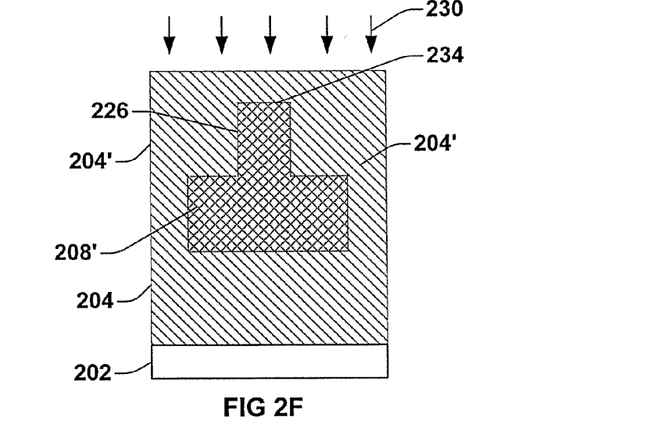

In FIG. 2F, low-k dielectric material 204' is deposited by process 230 to fill first 214(a) and second 214(b) recesses and overlying the upper surface 234 of the vertical element 226. Low-k dielectric material 204 thus encapsulates copper body 208'.

Figure 2G:
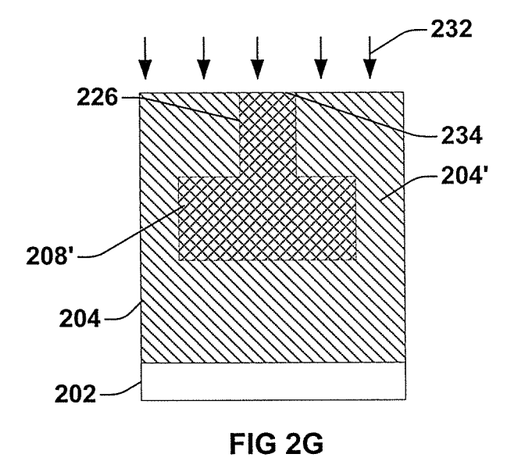
Figure 2H:
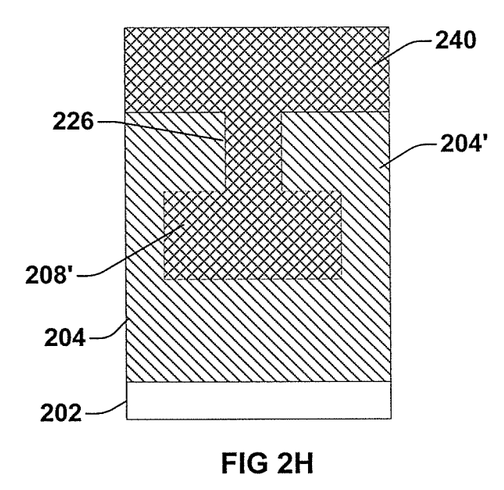
Figure 2I:
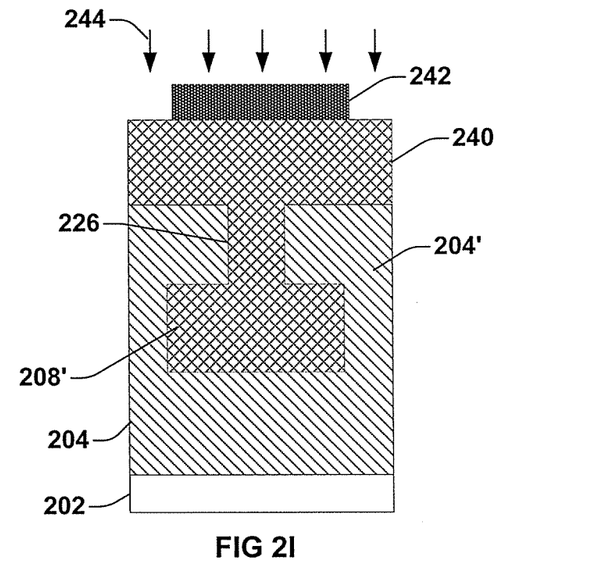
Figure 2J:
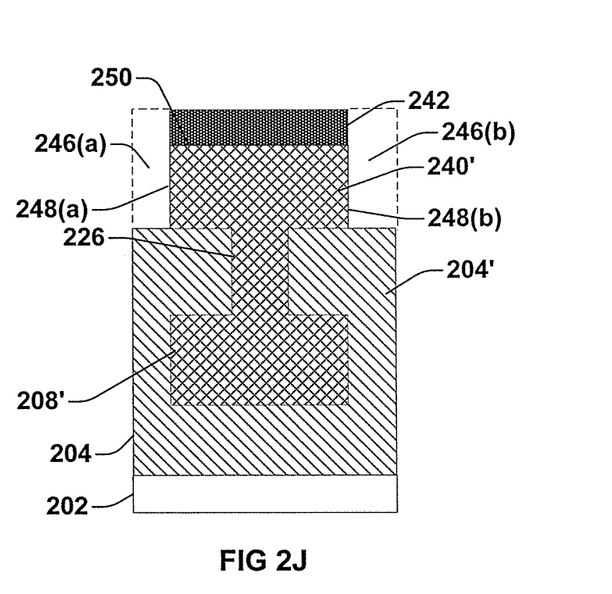

In FIG. 2G, a chemical mechanical polishing (CMP) process 232 is performed to expose upper surface 234 of the vertical element 226. An additional copper alloy layer 240 is formed overlying vertical element 226 and electrically coupled to vertical element 226, as illustrated in FIG. 2H. Photoresist 242 is then deposited in FIG. 2I by process 244 to pattern and etch copper alloy layer 240 to form recesses 246(a), 246(b) in copper alloy layer 240 to form an additional copper body 240' having opposing sidewalls 248(a), 248(b) and an upper surface 250 as illustrated in FIG. 2J. Photoresist 242 is then removed (not shown).

Figure 2K:
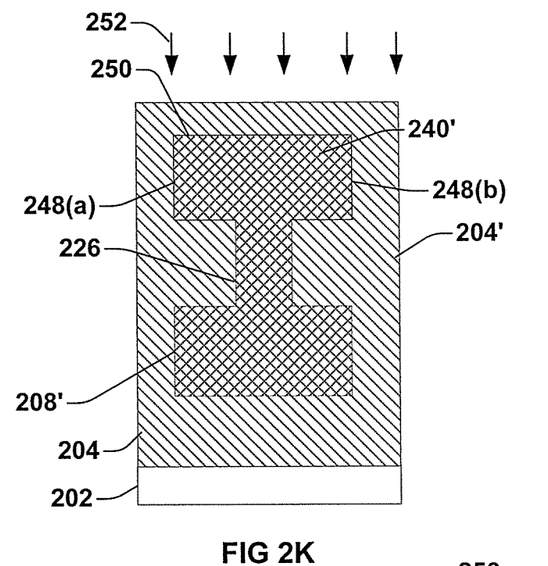
Figure 2L:
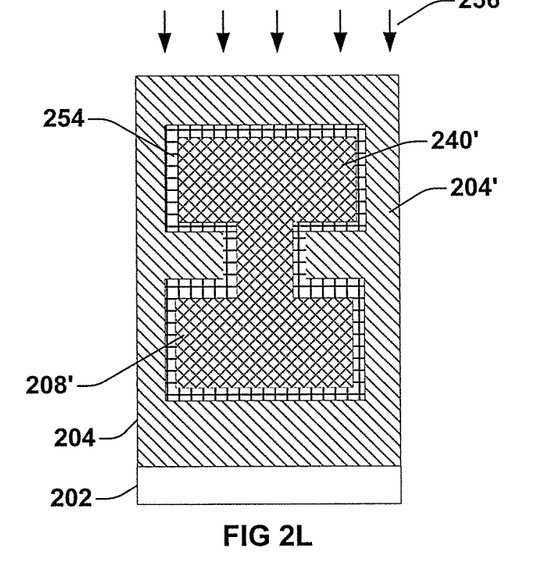

Low-k dielectric 204' is extended to encompass copper alloy body 240' by depositing 252 low-k dielectric 204' over opposing sidewalls 248(a), 248(b) and upper surface 250 of copper alloy body 240' in FIG. 2K. A barrier layer 254 is then formed by performing an anneal 256 at a temperature of about 400° C. or less, allowing metal alloy of copper alloy body 240' to react with low-k dielectric material 204' to form metal-low-k barrier layer 254 as illustrated FIG. 2L.

Figure 3:
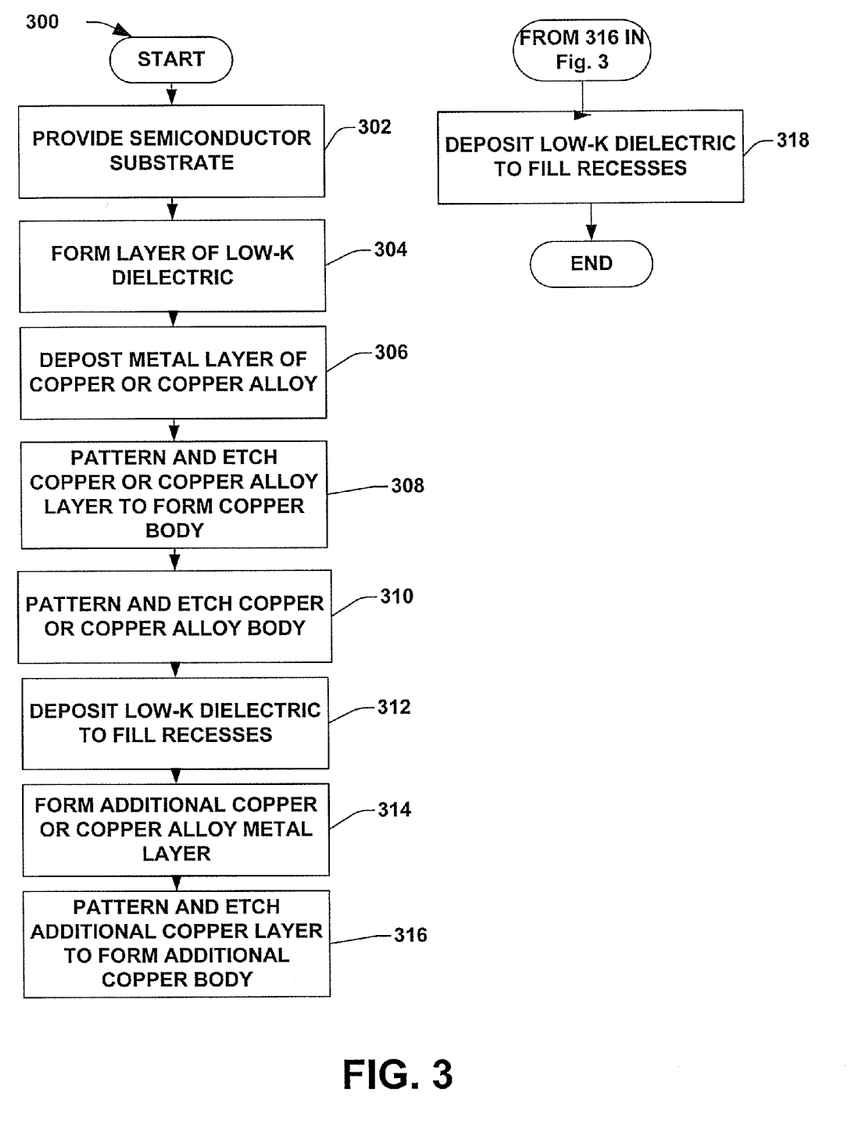
FIG. 3 illustrates a flow diagram of some embodiments of a method for the fabrication of a semiconductor structure in accordance with the disclosure.

FIG. 3 illustrates a flow diagram of some embodiments of a method 300 for formation of a semiconductor structure according to an embodiment of the invention. While method 200 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At step 302 a semiconductor substrate is provided. A low-k dielectric layer is then formed over the substrate at step 304.

At step 306, a metal layer of copper or copper alloys is deposited overlying the low-k dielectric layer.

At step 308, the copper or copper alloy layer is patterned and etched to form a copper body having first recesses about opposing sidewalls.

At step 310, the copper or copper alloy body is patterned and etched to form second recesses.

At step 312, low-k dielectric material is deposited to fill first and second recesses.

At step 314, an additional copper or copper alloy layer is formed overlying dielectric material.

At step 316, the additional copper or copper alloy layer is patterned and etched to form an additional copper body having additional recesses.

At step 318, a low-k dielectric material is deposited to fill additional recesses. The method then ends.

It will be appreciated that equivalent alterations and/or modifications may occur to one of ordinary skill in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

Therefore, the disclosure relates to method for forming an integrated circuit comprising providing a semiconductor substrate having a conductive region and forming a low-k dielectric layer overlying the silicon substrate. The method further comprises depositing a metal layer of a copper or copper alloy material over the dielectric layer, followed by patterning and etching of the copper or copper alloy metal layer. The patterning and etching of the copper or copper alloy metal layer defines a first feature having a copper body with first recesses and opposing sidewalls. The method further includes patterning and etching the copper or copper alloy body to define a second feature having second recesses in an upper region of the copper or copper alloy body.

The disclosure further relates to a method for forming an integrated circuit comprising providing a semiconductor substrate having a conductive region and forming a low-k dielectric layer overlying the substrate. The method further comprises forming a metal layer of copper or copper alloy over the dielectric. The method further comprises removing a portion of the copper or copper alloy layer to form a copper or copper alloy body with first recesses about opposing sidewalls of the copper or copper alloy body and then patterning and etching the copper or copper alloy body to form second recesses in an upper region of the body, defining a vertical element extending upward from a lower region of the body. The method further includes depositing a low-k dielectric material to fill first and second recesses and overlying an upper surface of the vertical element.

What is claimed is:

1. A method for forming an interconnect structure, comprising:
   providing a semiconductor substrate having a conductive region at a surface of the substrate;
   forming a layer of a low-k dielectric material over the substrate and covering the conductive region;
   depositing a metal layer of copper or copper alloy overlying the dielectric layer;
   forming a barrier layer between the low-k dielectric material and the copper or copper alloy metal layer;
   patterning and etching the copper or copper alloy metal layer to define a first feature having a copper or copper alloy body with first recesses about opposing sidewalls of the body;
   patterning and etching the copper or copper alloy body to define a second feature having second recesses in an upper portion of the body to define a via,
   wherein the metal layer is copper and forming the barrier layer comprises forming a first barrier layer overlying the low-k dielectric and subsequently forming a second barrier layer overlying the via.

2. The method of claim 1, wherein the first barrier layer and second barrier layer are continuous.

3. The method of claim 2, wherein the first and second barrier layers comprise the same material or different materials.

4. A method for forming a copper interconnect structure, comprising:
   providing a semiconductor substrate;
   forming a low k dielectric layer overlying the semiconductor substrate;
   forming a single, continuous metal layer of copper or copper alloy over the low-k dielectric;
   removing a portion of the single, continuous metal layer of copper or copper alloy to form a single, continuous copper or copper alloy body with first recesses about opposing sidewalls thereof;
   patterning the single, continuous copper or copper alloy body to form second recesses in an upper region of the single, continuous copper or copper alloy body to define a vertical element extending upward from a lower region of the single, continuous copper or copper alloy body;
   depositing low-k dielectric to fill first and second recesses and overlying an upper surface of the vertical element; and
   performing a chemical mechanical polishing to expose a top surface of the upper region of the single, continuous copper or copper alloy body.

5. The method of claim 4, wherein forming first recesses exposes an upper surface of the low-k dielectric layer.

6. The method of claim 5, wherein second recesses extend approximately one-half the thickness of the body.

7. The method of claim 4, wherein the upper region of the body is a via and the lower region of the body is an interconnect line.

8. The method of claim 4, further comprising forming an additional copper or copper alloy layer overlying the via and electrically coupled to the via.

9. A method for forming a copper interconnect structure, comprising:
   providing a semiconductor substrate;
   forming a low k dielectric layer overlying the semiconductor substrate;

forming a metal layer of copper or copper alloy over the low-k dielectric;

removing a portion of the copper or copper alloy layer to form a copper or copper alloy body with first recesses about opposing sidewalls of the copper or copper alloy body;

patterning and etching the copper or copper alloy body to form second recesses in an upper region of the body to define a vertical element extending upward from a lower region of the body; and depositing low-k dielectric to fill first and second recesses and overlying a top surface of the vertical element of the copper or copper alloy body, wherein after the low-k dielectric has been deposited to fill recesses, performing an anneal to form a barrier layer between the copper or copper alloy body and the low-k dielectric.

10. The method of claim 9, and further comprising:

subsequent to depositing the low-k dielectric to fill recesses, performing a planarization process to expose the top surface of the upper region of the copper or copper alloy body;

forming an additional metal layer of copper or copper alloy over the exposed top surface of the upper region of the copper or copper alloy body;

patterning the additional metal layer to form a metal feature of copper or copper alloy over the top surface of the upper region of the copper or copper alloy body;

depositing another low-k dielectric over the patterned metal feature of copper or copper alloy; and performing an anneal to form another barrier layer between the patterned metal feature of copper or copper allow and the another low-k dielectric.

11. A method for forming a copper interconnect structure, comprising:

providing a semiconductor substrate;

forming a low k dielectric layer overlying the semiconductor substrate;

forming a single, continuous metal layer of copper or copper alloy over the low-k dielectric;

removing a portion of the single, continuous metal layer of copper or copper alloy to form a single, continuous copper or copper alloy body with first recesses about opposing sidewalls thereof;

patterning the single, continuous copper or copper alloy body to form second recesses in an upper region of the single, continuous copper or copper alloy body to define a vertical element extending upward from a lower region of the single, continuous copper or copper alloy body;

depositing low-k dielectric to fill first and second recesses and overlying an upper surface of the vertical element; and forming a barrier layer over a top and sides of the vertical element extending upward from the lower region of the single, continuous copper or copper alloy body prior to depositing the low-k dielectric to fill the first and second recesses. dielectric to fill the first and second recesses.

* * * * *

UNITED STATES PATENT AND TRADEMARK OFFICE
CERTIFICATE OF CORRECTION

PATENT NO. : 8,735,278 B2
APPLICATION NO. : 13/550951
DATED : May 27, 2014
INVENTOR(S) : Ming Han Lee et al.

It is certified that error appears in the above-identified patent and that said Letters Patent is hereby corrected as shown below:

In the Claims

Column 8, Claim 10, Line 2  Please replace "allow" with --alloy--

Signed and Sealed this
Fifth Day of August, 2014

Michelle K. Lee
*Deputy Director of the United States Patent and Trademark Office*